United States Patent
Wei

(10) Patent No.: US 6,767,436 B2
(45) Date of Patent: Jul. 27, 2004

(54) METHOD AND APPARATUS OF PLASMA-ENHANCED COAXIAL MAGNETRON FOR SPUTTER-COATING INTERIOR SURFACES

(75) Inventor: Ronghua Wei, San Antonio, TX (US)

(73) Assignee: HRL Laboratories, LLC, Malibu, CA (US)

(*) Notice: Subject to any disclaimer, the term of this patent is extended or adjusted under 35 U.S.C. 154(b) by 2 days.

(21) Appl. No.: 10/256,151

(22) Filed: Sep. 25, 2002

(65) Prior Publication Data

US 2004/0055870 A1 Mar. 25, 2004

(51) Int. Cl.$^7$ .............................................. C23C 14/34
(52) U.S. Cl. .............................. 204/192.3; 204/298.08; 204/298.09; 204/298.14; 204/298.21; 204/298.37
(58) Field of Search ....................... 204/298.37, 298.09, 204/298.14, 298.21, 298.08, 192.3, 192.12

(56) References Cited

U.S. PATENT DOCUMENTS

| | | | | |
|---|---|---|---|---|
| 4,030,996 | A | | 6/1977 | Penfold et al. ......... 204/192.12 |
| 4,863,576 | A | * | 9/1989 | Collins et al. .......... 204/192.15 |
| 5,298,137 | A | | 3/1994 | Marshall, III .......... 204/192.12 |
| 5,529,674 | A | | 6/1996 | Hedgcoth .............. 204/298.21 |
| 5,571,393 | A | * | 11/1996 | Taylor et al. .......... 204/298.21 |
| 6,193,853 | B1 | | 2/2001 | Yumshtyk et al. ..... 204/192.12 |
| 2001/0047936 | A1 | * | 12/2001 | McLeod ................ 204/298.12 |

OTHER PUBLICATIONS

M. Minato and Y. Itoh, "Vacuum characteristics for TiN film coated on the interior surface of a vacuum duct." Nucl. instr. and Meth. In Phys. Res., vol. B 121, 1997, pp. 187–190.

N. Hosokawa, T. Tsukada, and T. Misumi, "Self–sputtering phenomena in high–rate coaxial cylindrical magnetron sputtering," J. Vac. Sci. Technol. vol. 14, No. 1, 1977, pp. 143–146.

J.N. Matossian, R. Wei, J. Vajo, G. Hunt, M. Gardos, G. Chambers, L. Soucy, D. Oliver, L. Jay, C.M. Taylor, G. Alderson, R. Komanduri, and A. Perry, Plasma–enhanced, magnetron–sputtered deposition (PMD) of materials, Surf. Coat. Technol., vol. 108–109, 1998, pp. 496–506.

R. Wei, "Low energy, high current density ion implantation of materials at elevated temperatures for tribological applications," Surface and Coatings Technology 83 (1996) 218–227.

* cited by examiner

*Primary Examiner*—Steven VerSteeg
(74) *Attorney, Agent, or Firm*—Tope-McKay & Associates

(57) ABSTRACT

A plasma-enhanced coaxial magnetron sputter-cleaning and coating assembly for sputter-cleaning and coating the interior surfaces of a cylindrical workpiece is provided. The apparatus sputter-coats the workpiece using a cylindrical sputtering material, the material having an interior and an exterior. The apparatus includes a core cooling system surrounded by a ring magnet assembly including a plurality of axially aligned ring magnets, with the core cooling system and the ring magnet assembly axially aligned with, and residing in the interior of, the cylindrical sputtering material. A cylindrical-shaped filament circumferentially surrounds the exterior of the cylindrical sputtering material. An anode comprised of a wire screen circumferentially surrounds, and is external to the filament; whereby the apparatus for plasma-enhanced coaxial magnetron sputter-cleaning and coating may be housed inside the workpiece in order to sputter-clean and coat the interior of the workpiece.

17 Claims, 3 Drawing Sheets

METHOD AND APPARATUS OF PLASMA-ENHANCED COAXIAL MAGNETRON FOR SPUTTER-COATING INTERIOR SURFACES

TECHNICAL FIELD

The present invention relates generally to electrode-type glow discharge devices used in the field of thin film deposition, and more particularly to a method and apparatus for applying coating by magnetron sputtering in which surface cleaning and material deposition are provided in a continuous process.

BACKGROUND OF THE INVENTION

Magnetron sputtering is a well-known technique for depositing thin coatings onto objects. Sputtering of the coating onto an object occurs by generating plasma over the surface of an emitter material in a low-pressure gas atmosphere. An electrical field accelerates ions from the plasma to bombard and eject atoms from the surface of the emitter. Once ejected, the atoms travel through the gas environment and impact the surface of a target object to be coated, bonding to the target object and forming a coating layer. During the deposition process, a high ratio of ion-to-neutral fluxes is desirable to produce a dense, hard film with a low stress.

Prior to bombarding the target to form the coating layer, however, the surface of the target object must be clean and free from impurities. Generally, surface cleaning is performed through the process of sputter cleaning, in which the surface of a target object is bombarded with ions generated by a magnetron. A high current density bombardment of the surface of the target object is desirable in order to ensure a clean surface, and along with the use of a high ratio of ion-to-neutral fluxes during the deposition process, will produce a high quality film.

Presently, there are two methods used to accomplish the surface cleaning. In the first, a separate system for the sputter-cleaning process may be used, where the plasma is generated proximate the surface of the target object, and then the surface is bombarded with ions from the plasma that are drawn to the substrate by a filament or an RF source. After the sputter-cleaning process is completed, the target object can be transferred into the coating system for film deposition. This method is inconvenient and does not guarantee a clean surface, since oxidation will occur during the interruption between sputter-cleaning and sputter-coating. In the second method, the same system may be used for sputter-cleaning and the film deposition process. Theoretically, a plasma can be generated by turning on the magnetron and applying a voltage to the target object. Ions can then be drawn to the surface of the target object with a bias voltage. If the bias voltage is sufficiently high, the ions will cause sputtering of the surface. When the bias voltage is reduced, the film deposition process may begin. This is a typical approach used in most magnetron sputtering systems. Although this approach appears, on the surface, to be simple and without interruption during the transition, it has significant shortcomings. In order to increase the sputter-cleaning rate to remove native oxides and prevent the surface from re-oxidation, the bias voltage and/or the current density must be increased. In addition, during the cleaning, film deposition should be avoided. However, with existing magnetron systems wherein the plasma is generated by the magnetron, during the cleaning process the filament material is also sputtered and unavoidably deposited onto the target object. Moreover, an increase in the magnetron power, which results in an increased current density, will not help because it also increases the emitter material ionization, resulting in an increased rate of film deposition on the surface of the target object. Although an increase in the substrate voltage would increase the bombardment rate, the magnetron must be operated to provide ions for bombardment, which necessarily would result in film deposition. This hinders the cleaning of the surface oxides, which exist on almost all metals. Also, with this method, when the film deposition process begins, to obtain a high ion flux, the magnetron power has to be increased. At the same time, the flux of neutrals sputtered from the emitter material becomes proportionally higher. As a result, the ion-to-neutral ratio remains nearly constant and endangers the quality of the film. Therefore, a compromise must be made in which a low current density with a high bias voltage must be used in order to minimize film deposition.

In addition to the problems associated with current attempts to combine the sputter-cleaning and deposition processes, in many sputter coating apparatuses, the sputtering voltage is applied with respect to end plates residing substantially perpendicular to the surface to be coated. Because the strength of the magnetic field varies along the distance between the end plates (e.g. along the surface of the target object), the non-uniformity of the magnetic field can result in a non-uniform coating. This is particularly true in the case where the target object is elongated, requiring an increased distance between the end plates.

Therefore, a need exists in the art to provide an integral sputter-cleaning and film deposition mechanism wherein the current density can be as high as necessary to effectively support the sputter-cleaning process without causing the ionization of the emitter material that results in film deposition. A further need exists to provide a mechanism for generating a uniform electric field with respect to the surface of the target object to be coated such that the cleaning and deposition is uniform along the surface of the object coated.

The following references are provided for further reference regarding magnetron sputter deposition:

M. Minato and Y. Itoh, "Vacuum Characteristics of TiN Film Coated on the Surface of a Vacuum Duct," *Nucl. Instr. and Meth. In Phys. Res.*, Vol. B 121, 1997, pp. 187–190.

S. Penfold and J. A. Thornton, U.S. Pat. No. 4,030,996, Jun. 21, 1997.

N. Hosokawa, T. Tsukada and T. Misumi, "Self-Sputtering Phenomena in High-Rate Coaxial Cylindrical Magnetron Sputtering," *J. Vac. Sci. Technol.* Vol. 14, No. 1, 1977, pp. 143–146.

R. Wei, "Low-Energy, High-Current-Density Ion Implantation of Materials at Elevated Temperatures for Tribological Applications," *Surf. Coat. Technol.*, Vol. 83, 1996, pp. 218–227.

J. N. Matossian, R. Wei, J. Vajo, G. Hunt, M. Gardos, G. Chambers, L. Soucy, D. Oliver, L. Jay, C. M. Tylor, G. Alderson, R. Komanduri and A. Perry, "Plasma-Enhanced, Magnetron-Sputtered Deposition (PMD) of Materials," *Surf. Coat. Technol.*, Vol. 108–109, 1998, pp. 496–506.

SUMMARY OF THE INVENTION

The present invention is directed toward a new and different plasma enhanced coaxial magnetron sputtering system that is suitable for depositing a thin film of sputtered material onto a substrate. Unlike the prior art devices, the present invention utilizes two steps for depositing a thin film, instead of one.

The plasma enhanced coaxial magnetron (PECM) assembly consists of a cooling system, ring magnets, a cylindrical sputtering target material, electron emitter filaments, a cylindrical meshed anode, and power supplies. This assembly is placed in the center of a cylindrical substrate that is to be coated. Both the PECM assembly and the tube substrate are housed in a vacuum chamber. The operation of this apparatus is detailed in two steps: sputter cleaning without target material deposition and uniform sputter coatings of cylindrical substrate.

When the vacuum system is pumped down, typically to the low $10^{-6}$ Torr range, a working gas (Ar) is introduced to the chamber to a pressure typically of a few milli-Torr. Then, an AC voltage $V_f$ is applied to the filaments to heat them up to a thermionic temperature (~2000° C. for tungsten). Electrons are then generated. With the application of a DC voltage $V_d$ between the anode and the filaments, the electrons will migrate to the anode. Due to the strong magnetic field generated by the ring magnets, the electrons will experience many collisions with the gas before reaching the anode, resulting in high ionization of the gas, thereby producing an intense plasma. A negative voltage $V_b$ is then applied to the substrate, resulting in a removal of oxides from the substrate and effective sputter cleaning.

It has been observed that two types of oxide may occur in plasma processing of materials. One is the "native oxide" that forms naturally on many materials when they are exposed to ambient environments. The other is a re-oxidation that forms on the substrate surface during plasma processing due to the outgassing of water moisture adsorbed on the substrate and the vacuum chamber. Without additional care being taken, the thickness of the oxide due to re-oxidation could exceed the native oxide removed in the previous step.

Depending on the vacuum system and the substrate utilized, outgassing may take 30 minutes to several hours. In ideal conditions, during this time period, no film deposition should occur. In order to remove the native oxide and prevent the surface from re-oxidation, the sputtering rate should be maintained at greater than the sticking rate of water molecules. The sputter-cleaning rate depends on both the ion current density and the ion energy at the substrate.

In the present invention, the high ion current density comes from the discharge power of the filament current and the discharge voltage $V_d$ and is enhanced by the magnetic field. The current density is much higher than that produced by the magnetron alone. After the outgassing process has diminished, and the surface oxide has been removed, and with the ion bombardment continuing, the magnetron power supply $V_T$ is turned on. Now sputtering of the target material starts, as does the deposition of the film. During the transition from the sputter cleaning to the film deposition, the substrate bias $V_b$ remains high (~100–1000V) for set time, and then reduces to a low level (~50V) to ensure a good interface. Since in this technique the current density and the ion energy can be controlled separately, the broad range of requirements for the cleaning and film deposition can be met readily.

BRIEF DESCRIPTION OF THE DRAWINGS

The invention will now be described by way of exemplary embodiments with reference to the accompanying simplified, diagrammatic, not-to-scale drawings. In the drawings.

DETAILED DESCRIPTION OF THE INVENTION

The present invention is a plasma enhanced coaxial magnetron sputter-coating system for coating the internal surface of a cylindrical workpiece. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiment presented, but is to be accorded the widest scope consistent with the principles and novel features disclosed herein.

Introduction

The present invention provides a method and apparatus for sputter-cleaning the surface of a target object (workpiece) and for sputter coating (film deposition) thereon subsequent to the cleaning. Additionally, in the apparatus of the present invention, a mesh anode configured to reside substantially parallel to the surface of the target object is provided in order to ensure a uniform plasma distribution parallel to the surface of the target object and to ensure uniform sputter-cleaning and film deposition thereon. The mesh anode facilitates uniform sputter coatings of the interior surfaces of generally cylindrical objects having high aspect ratios.

The present invention operates in several steps. First the volume surrounding the magnetron and the surface to be coated is evacuated with a vacuum pump, removing the gas from the chamber. Then, a working gas such as argon is introduced into the chamber, and continually flows through the chamber throughout the cleaning and deposition processes. Next, plasma is generated, and ions from the plasma are bombarded with the surface of the target object to provide sputter cleaning. As the surface is cleaned, outgassing of water molecules from the surface of the target object and from the surface of the vacuum chamber occurs. The sputter cleaning must be maintained during the offgassing to prevent surface re-oxidation. After the sputter cleaning is complete and the offgassing has finished, the sputter coating occurs and results in a uniform film deposition onto the surface of the target object.

Details of the Present Invention

Figure 1:
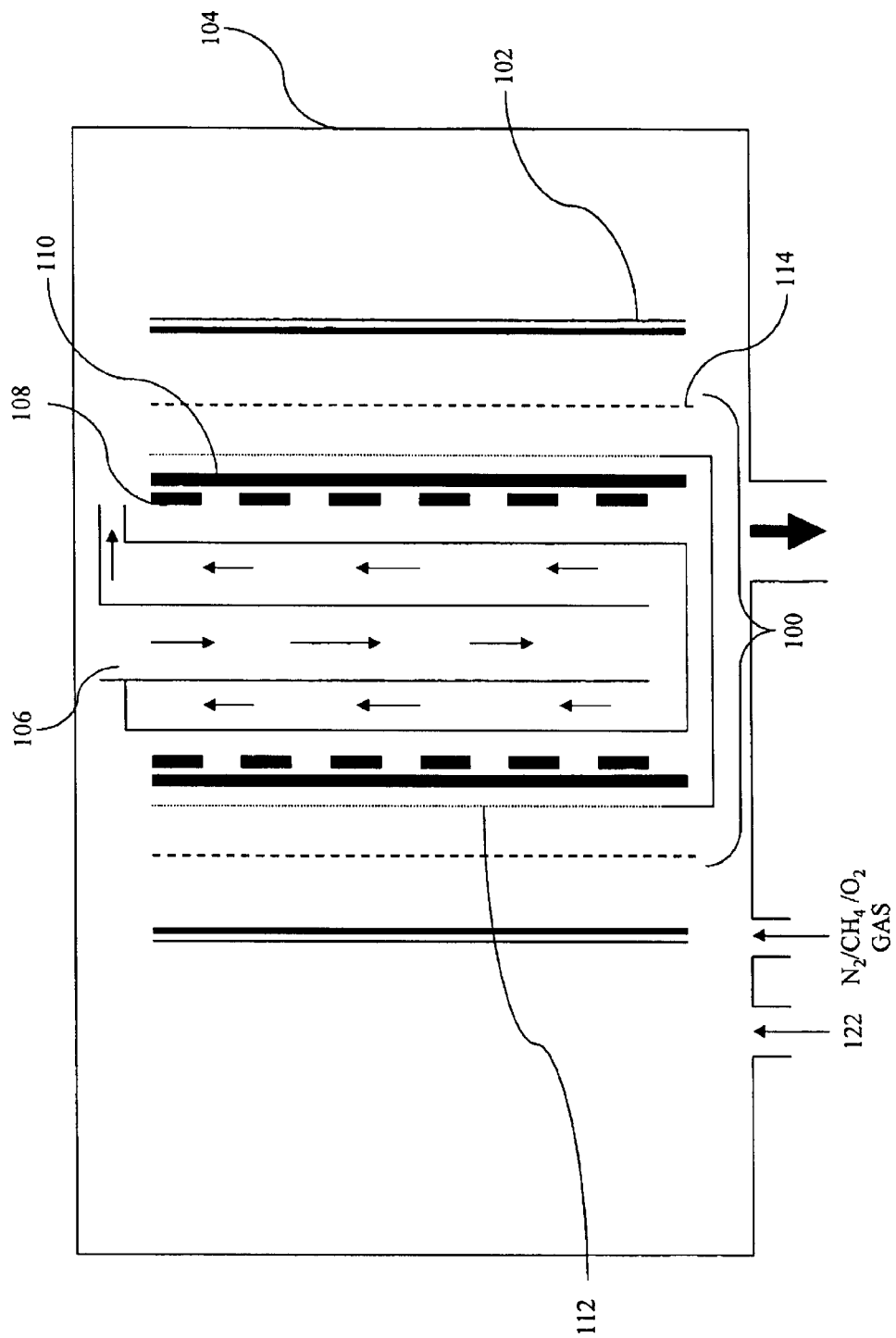
FIG. 1 is a cross-sectional view of an embodiment of the apparatus of the present invention.

A cross-sectional view of the apparatus of the present invention is shown in FIG. 1. The apparatus generally comprises a magnetron assembly 100 centered within in a workpiece 102 (typically a conductive, substantially cylindrical object), with the magnetron assembly 100 and the workpiece 102 being housed in a vacuum chamber 104. Alternatively, the ends of the workpiece 102 may be sealed and the interior volume of the workpiece 102 may be evacuated to form a vacuum.

The magnetron assembly 100, in turn, comprises a cooling system 106, a plurality of ring magnets 108 surrounding and cooled by the cooling system 106, a cylindrical sputtering material 110, though not, strictly speaking, a part of the magnetron assembly 100, electron emitters 112 (e.g.

tungsten filaments or filaments of a like material), a cylindrical meshed anode 114 (composed of a wire screen), a electron discharge voltage supply $V_{AE}$ 116 for applying a potential between the anode 114 and the electron emitters 112, a alternating voltage supply $V_{AC}$ 118 for heating the electron emitters 112 to a thermionic temperature in order to generate free electrons, a workpiece biasing voltage supply $V_{WV}$ 120 for negatively biasing the workpiece 102 with respect to the anode 114 (and also connected with the vacuum chamber 104), and a magnetron voltage supply $V_M$ 122 for biasing the cylindrical sputtering material 110 with respect to the electron emitters 112. Note that some of the references for the structures described in this paragraph may be found on FIGS. 2 and 3. This is simply for the convenience of minimizing the cluttering of the figures.

In practice, the present invention operates to provide sputter cleaning and then smoothly transitions to provide sputter deposition of the sputtering material 110 onto the surface of the workpiece 102. These two operations are detailed as follows.

Sputter Cleaning Operation

Figure 2:
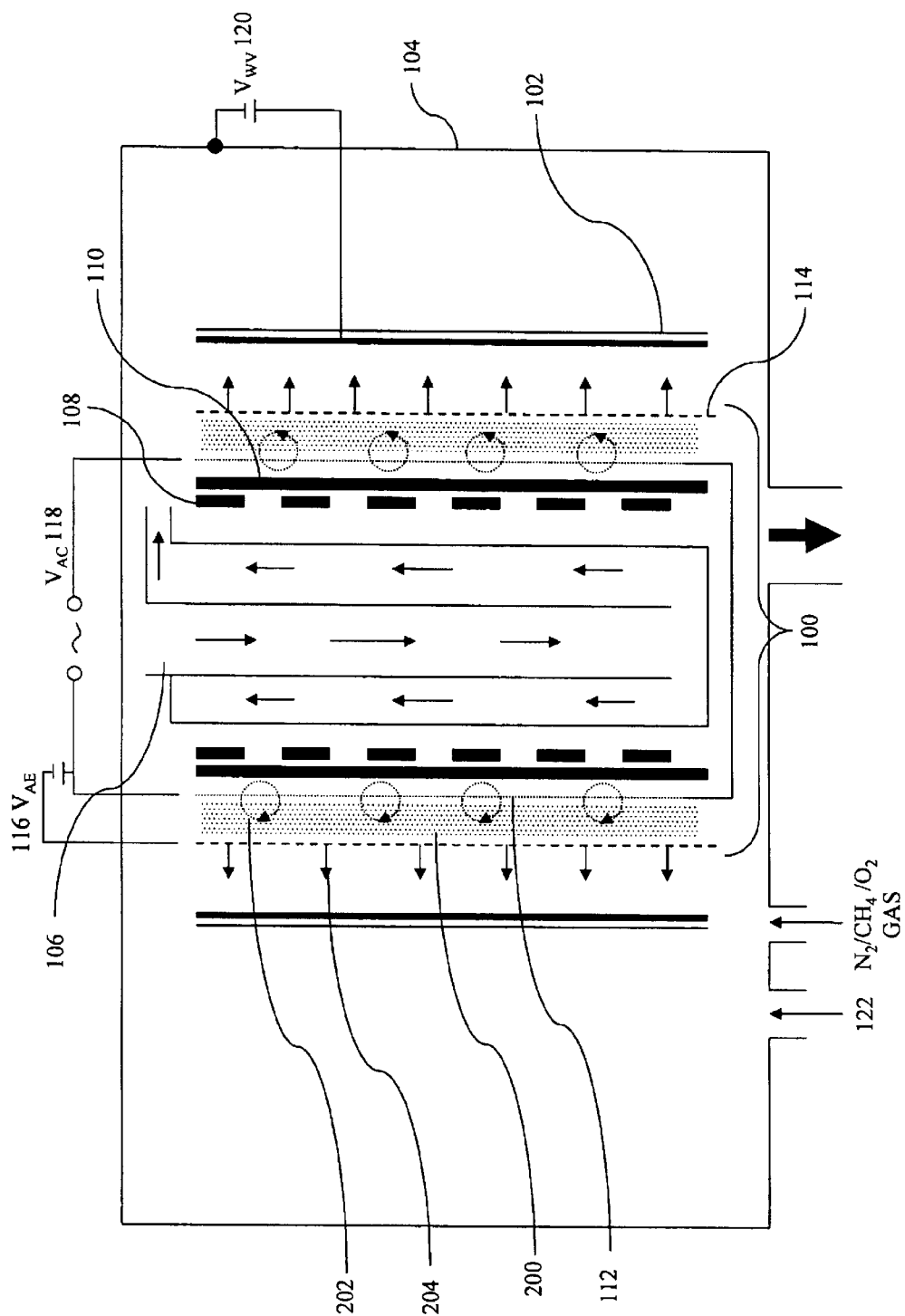
FIG. 2 is a cross-sectional view of an embodiment of the present invention during sputter-cleaning of a workpiece.

The sputter cleaning operation of the present invention is shown in the cross-sectional view presented in FIG. 2. Before sputter cleaning begins, a vacuum pump (not shown) removes gasses from the vacuum chamber 104 via an outlet, creating a vacuum (typically in the low $10^{-6}$ Torr range). A working gas, preferably argon, is then introduced (typically increasing the pressure to a few few milli-Torr) via a working gas inlet 122. The working gas is continually circulated through the vacuum chamber 104 throughout both the sputter cleaning and the sputter deposition processes.

After the evacuation of gasses from the vacuum chamber 104 and the subsequent circulation of the working gas has begun, the alternating voltage supply $V_{AC}$ 118 is applied to the electron emitters 112, heating the material of the electron emitters 112 to a thermionic temperature (e.g., ~2000° C. for tungsten), and generating free electrons. An electron discharge voltage supply $V_{AE}$ 116 provides a potential (typically about 50 V) between the anode 114 and the electron emitters 112, resulting in electron migration from the emitter 112 toward the anode 114. Due to the strong magnetic field generated by the plurality of ring magnets 108, the electrons will experience many collisions with the working gas en-route to the anode 114, resulting in high ionization of the working gas, thereby producing a plasma 200 in the region between the cylindrical sputtering material 110 and the anode 114.

It is important to note that the flux lines 202 surrounding each one of the plurality of ring magnets 108 are circular and, therefore, irregular with respect to the surface of the cylindrical sputtering material 110. The anode 114 of the present invention is designed to overcome this limitation by partially trapping the plasma 200 between the cylindrical sputtering material 110 and the anode 114, resulting in better circulation, and thus improved uniformity of the plasma distribution along the surface of the workpiece 102. Without the wire mesh anode 114, the plasma 200 distribution would be somewhat irregular, resulting in the deposition of a non-uniform coating during the sputter coating process and irregular cleaning during the cleaning process.

A negative workpiece biasing voltage supply $V_{WV}$ 120 is then applied to the workpiece 102 with respect to the anode 114 and the vacuum chamber 104. Ions 204 are then drawn out of the plasma 200 from the anode 114 to the surface of the workpiece 102. The bombardment of ions 204 onto the surface of the workpiece 102 results in sputter cleaning and a removal of oxides. Once the surface is sufficiently clean, the magnetron voltage supply $V_M$ 122 is powered and the cylindrical sputtering material 110 is sputtered onto the surface of the workpiece 102, beginning the sputter deposition operation.

It is important to properly transition from sputter cleaning to sputter deposition to ensure that the surface of the workpiece 102 remains clean. Two types of surface oxides may occur in plasma processing of materials. The first is a native oxide that forms naturally on many materials when they are exposed to ambient environments. The other oxide that may form on the surface is a reoxidation during plasma processing due to the outgassing of water adsorbed on the workpiece 102 and the vacuum chamber 104. If extra care is not taken, the thickness of the oxide due to re-oxidation could be much thicker than the native oxide and the coating would perform poorly. Both the removed native oxide and the water outgassed from the workpiece 102 and the vacuum chamber 104 should be removed prior to the sputter deposition operation begins. Depending on the rate of flow of the working gas through the vacuum chamber 104 (a function of the vacuum system) and the particular workpiece 102, removal of these products generally takes in the neighborhood of 30 minutes to a few hours. Ideally, during this time, no sputter deposition occurs. In order to remove the native oxide and prevent the surface of the workpiece 102 from re-oxidation, the sputtering cleaning rate should be maintained at greater than the sticking rate of water molecules.

The sputter cleaning rate depends on both the ion current density and the ion energy at the surface of the workpiece 102. In the present invention, a high ion current density is provided by a combination of the discharge voltage, the anode/emitter electron discharge voltage supply $V_{AE}$ 116 and the power supply $V_{AC}$ 118 to the electron emitters 112, and is enhanced by the magnetic field provided by the plurality of ring magnets 108. This resulting current density is much higher than that produced as a result of the magnetron voltage supply $V_M$ 122 alone. After the outgassing process has diminished and the surface oxide has been removed, and with ion bombardment from the sputter cleaning operation continuing, the magnetron voltage supply $V_M$ 122 is turned on.

Sputter Deposition Operation

Figure 3:
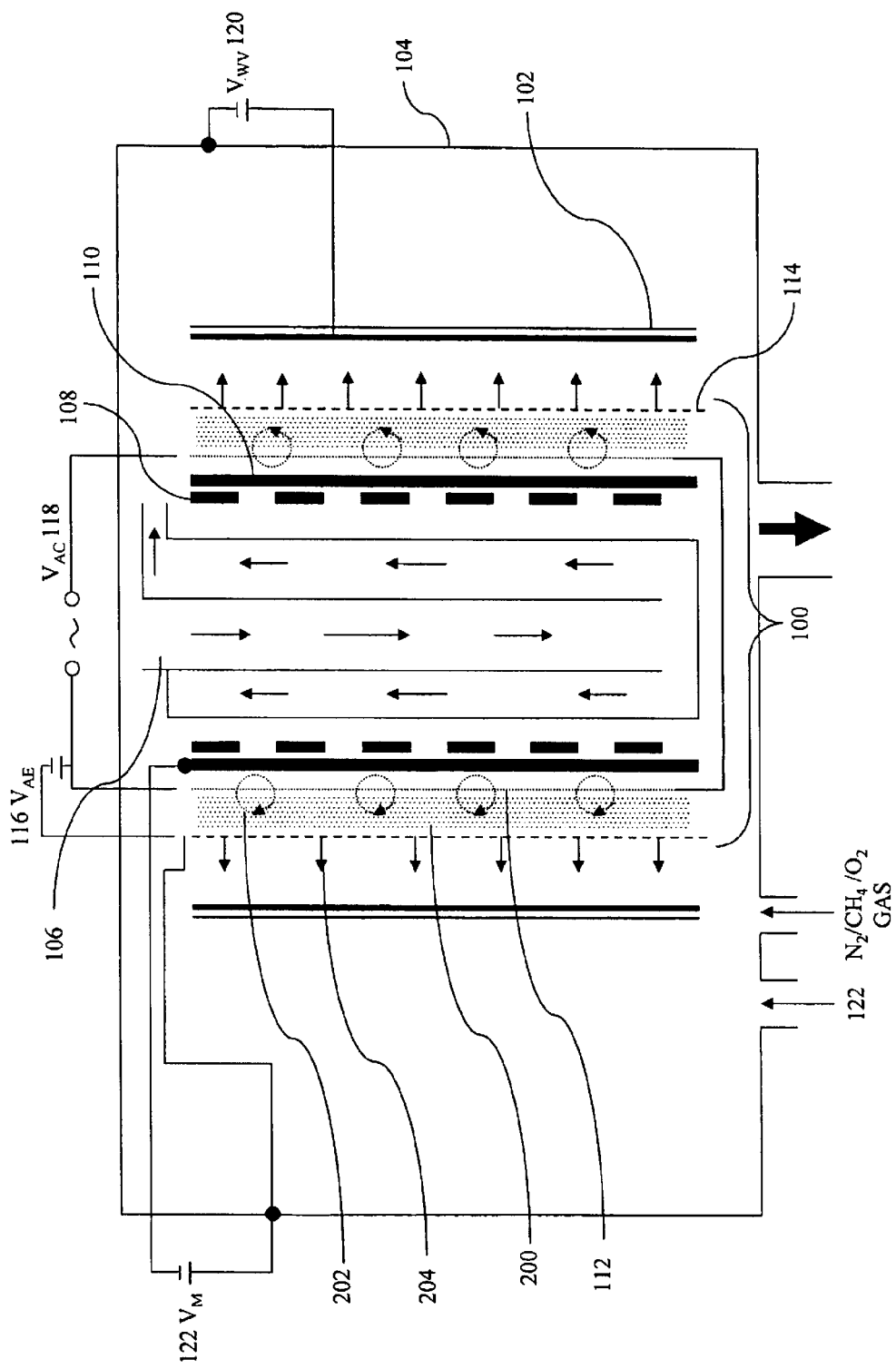
FIG. 3 is a cross-sectional view of an embodiment of the present invention during the sputter-coating of a workpiece.

A cross-sectional view of the apparatus of the present invention during the sputter deposition operation is provided in FIG. 3. After the removal of oxides has been completed and the magnetron voltage supply $V_M$ 122 has been turned on, the sputter deposition process begins. During the transition from the sputter cleaning process to the film deposition process, the negative bias of the workpiece 102 with respect to the anode 114 caused by the workpiece biasing voltage $V_{WV}$ 120 remains high (generally approximately 100 to 1000 V), for a time and is then reduced to a low level (generally approximately 50V) to ensure a good interface. Since the current density and the ion energy can be controlled through separate power sources, a broad range of requirements for sputter cleaning and sputter deposition processes can readily be met.

The apparatus of the present invention is readily applicable for the deposition of many metallic coatings (non-limiting examples of which include Ti, Al, Fe, Ni, Cr, and W), as well as various nitrides, oxides, or carbides (non-limiting examples of which include TiN, $Al_2O_3$, and WC) onto the surface of a workpiece 102. An important aspect of the present invention lies in the fact that it provides high but independent control of ion-to-neutral flux for the sputter deposition process. A high ion-to-neutral ratio in the plasma is desired for high quality coatings. Since the ion current is mainly controlled by the power to the electron emitters 112, which comprises the power supply $V_{AC}$ 118 and the electron discharge electron discharge voltage supply $V_{AE}$ 116, and the flux of neutrals in the plasma is controlled by the magnetron voltage supply 122, a high electron discharge power with a low magnetron power may be used to obtain the high ion-to-neutral ratio. In other cases, where a low ion-to-neutral ratio may be needed, both power supplies may be easily adjusted since they are nearly independent. It is also noteworthy that a much higher sputtering rate of the target material can be achieved through the use of filaments for the electron emitters 112 because of the extra electrons, allowing for an increased rate of sputter coating.

In addition to these advantages, the meshed anode 114 uniformly surrounds the magnetron, providing a uniform field for the magnetron. Therefore, a uniform plasma can be generated, providing a uniform sputtering of the surface of the workpiece 102, and hence a uniform coating can be obtained. Additionally, since the anode 114 is also electrically connected with the vacuum chamber 104, it provides the workpiece 102 with a uniform electric field through the application of the potential difference created by the workpiece biasing voltage supply 120. Thus, the voltage $V_{AE}$ applied between the meshed anode 114 and the electron emitters 112 not only enhances the production of the plasma; it also provides the magnetron 100 with a uniform electric field with respect to the surface of the workpiece 102, ensuring a constant plasma density along the surface of the workpiece 102 which allows for a uniform erosion of the target material and uniform sputtering deposition on the tube. An advantage of this configuration is that it allows the magnetron system 100 to be extended for longer workpieces 102 (i.e., workpieces 102 having a high aspect ratio) without sacrificing the uniformity of the sputter coating and sputter deposition operations.

What is claimed is:

1. A plasma-enhanced coaxial magnetron sputter-cleaning and coating assembly for sputter-cleaning and coating the interior surfaces of a cylindrical workpiece with a cylindrical sputtering material, the cylindrical sputtering material having an interior and an exterior, and the apparatus comprising:
   i. a core cooling system surrounded by a ring magnet assembly including a plurality of axially aligned ring magnets, with the core cooling system and the ring magnet assembly axially aligned with, and residing in the interior of, the cylindrical sputtering material;
   ii. a cylindrical-shaped filament circumferentially surrounding the exterior of the cylindrical sputtering material; and
   iii. an anode comprised of a wire screen circumferentially surrounding, and external to the filament; whereby the apparatus for plasma-enhanced coaxial magnetron sputter-cleaning and coating may be housed inside the workpiece in order to sputter-clean and coat the interior of the workpiece.

2. A plasma-enhanced coaxial magnetron sputter-cleaning and coating assembly as set forth in claim 1, further comprising a vacuum chamber having a working gas inlet and a working gas outlet, the vacuum chamber surrounding the workpiece whereby the assembly and the workpiece may be subjected to a vacuum during sputter-cleaning and coating, and whereby a working gas may be introduced into and removed from the vacuum chamber.

3. A plasma-enhanced coaxial magnetron sputter-cleaning and coating assembly as set forth in claim 2, further comprising:

i. an alternating voltage source $V_{AC}$ connected with the filament such that when activated in a vacuum, the alternating voltage source $V_{AC}$ causes the filament to achieve a thermionic temperature and to generate free electrons;
   ii. a electron discharge voltage supply $V_{AE}$ connected between the mesh anode and the filament, such that when activated in a vacuum when free electrons have been generated, the electron discharge voltage supply $V_{AE}$ urges electrons to migrate toward the mesh anode, and where the ring magnets cause collisions between a working gas and the electrons before the electrons reach the mesh anode, whereby plasma may be generated between the filament and the workpiece;
   iii. a negative workpiece biasing voltage $V_{WV}$ that when applied to the workpiece while a plasma exists between the filament and workpiece, causes ions to migrate from the plasma against the workpiece, uniformly through the anode, causing surface oxidation to be removed from the workpiece by ion sputtering; and
   iv. a magnetron voltage supply $V_M$, connected with the workpiece and a ground, that when applied as the surface oxidation is nearly removed from the workpiece by ion sputtering, will cause material from the exterior of the cylindrical sputtering material to sputter onto the workpiece.

4. A plasma-enhanced coaxial magnetron sputter-cleaning and coating assembly as set forth in claim 1, further comprising a scaling means, having a working gas inlet and a working gas outlet, for sealing the workpiece such that a vacuum may be formed therein whereby the assembly and the interior of the workpiece may be subjected to a vacuum during sputter-cleaning and coating, and whereby a working gas may be introduced into and removed from the vacuum formed in the workpiece.

5. A plasma-enhanced coaxial magnetron sputter-cleaning and coating assembly as set forth in claim 4, further comprising:

i. an alternating voltage source $V_{AC}$ connected with the filament such that when activated in a vacuum, the alternating voltage source $V_{AC}$ causes the filament to achieve a thermionic temperature and to generate free electrons;
   ii. a electron discharge voltage supply $V_{AE}$ connected between the mesh anode and the filament, such that when activated in a vacuum when free electrons have been generated, the electron discharge voltage supply $V_{AE}$ urges electrons to migrate toward the mesh anode, and where the ring magnets cause collisions between a working gas and the electrons before the electrons reach the mesh anode, whereby plasma may be generated between the filament and the workpiece;
   iii. a negative workpiece biasing voltage $V_{WV}$ that when applied to the workpiece while a plasma exists between the filament and workpiece, causes ions to migrate from the plasma against the workpiece, uniformly through the anode, causing surface oxidation to be removed from the workpiece by ion sputtering; and
   iv. a magnetron voltage supply $V_M$, connected with the workpiece and a ground, that when applied as the surface oxidation is nearly removed from the workpiece by ion sputtering, will cause material from the exterior of the cylindrical sputtering material to sputter onto the workpiece.

6. A plasma-enhanced coaxial magnetron sputter-cleaning and coating assembly as set forth in claim 1, further comprising:

i. an alternating voltage source $V_{AC}$ connected with the filament such that when activated in a vacuum, the alternating voltage source $V_{AC}$ causes the filament to achieve a thermionic temperature and to generate free electrons;

ii. a electron discharge voltage supply $V_{AE}$ connected between the mesh anode and the filament, such that when activated in a vacuum when free electrons have been generated, the electron discharge voltage supply $V_{AE}$ urges electrons to migrate toward the mesh anode, and where the ring magnets cause collisions between a working gas and the electrons before the electrons reach the mesh anode, whereby plasma may be generated between the filament and the workpiece;

iii. a negative workpiece biasing voltage $V_{WV}$ that when applied to the workpiece while a plasma exists between the filament and workpiece, causes ions to migrate from the plasma against the workpiece, uniformly through the anode, causing surface oxidation to be removed from the workpiece by ion sputtering; and iv. a magnetron voltage supply $V_M$, connected with the workpiece and a ground, that when applied as the surface oxidation is nearly removed from the workpiece by ion sputtering, will cause material from the exterior of the cylindrical sputtering material to sputter onto the workpiece.

7. A method for plasma-enhanced coaxial magnetron sputter-cleaning and coating the interior surfaces of a cylindrical workpiece with a cylindrical sputtering material, where the cylindrical sputtering material has an interior and an exterior, the method comprising the steps of:

i. placing, within the interior of the cylindrical sputtering material, a core cooling system surrounded by a ring magnet assembly including a plurality of axially aligned ring magnets, with the core cooling system and the ring magnet assembly axially aligned with, the interior of, the cylindrical sputtering material;

ii. placing a cylindrical-shaped filament circumferentially around the exterior of the cylindrical sputtering material;

iii. placing an anode comprised of a wire screen circumferentially around, and external to the cylindrical-shaped filament such that the core cooling system, the cylindrical-shaped filament, and the anode comprise a sputter-cleaning and coating assembly;

iv. placing the sputter cleaning and coating assembly and the cylindrical sputtering material in the interior of the workpiece; and v. activating the sputter cleaning and coating assembly to sputter-clean and sputter coat the interior of the workpiece.

8. A method for plasma-enhanced coaxial magnetron sputter-cleaning and coating the interior surfaces of a cylindrical workpiece with a cylindrical sputtering material, as set forth in claim 7, wherein the step of activating the sputter cleaning and coating assembly includes the sub steps of:

i. forming a vaccum in the interior of the workpiece by removing gases;

ii. introducing a working gas into the vacuum;

iii. ion sputter-cleaning the interior of the workpiece; and iv. high ion bombarding the interior of the workpiece with material from the cylindrical sputtering material to result in film deposition on the interior surface of the workpiece.

9. A method for plasma-enhanced coaxial magnetron sputter-cleaning and coating the interior surfaces of a cylindrical workpiece with a cylindrical sputtering material, as set forth in claim 8, wherein the step of forming a vacuum in the interior of the workpiece includes the sub steps of:

(a) sealing the interior of the workpiece; and (b) removing the gases from the interior of the workpiece.

10. A method for plasma-enhanced coaxial magnetron sputter-cleaning and coating the interior surfaces of a cylindrical workpiece with a cylindrical sputtering material, as set forth in claim 8, wherein the step of forming a vacuum in the interior of the workpiece includes the sub steps of:

(a) placing the workpiece into a vacuum chamber; and (b) removing the gases from the interior of the workpiece.

11. A method for plasma-enhanced coaxial magnetron sputter-cleaning and coating the interior surfaces of a cylindrical workpiece with a cylindrical sputtering material, as set forth in claim 8, wherein the step of ion sputter-cleaning the interior of the workpiece includes the sub steps of:

(a) applying an alternating voltage $V_{AC}$ to the filament such that the filament achieves thermionic temperature and generates free electrons;

(b) applying an electron discharge voltage $V_{AE}$ between the mesh anode and the filament such that it urges electrons to migrate toward the mesh anode, with the ring magnets causing collisions between a working gas and the electrons before the electrons reach the mesh anode to generate a plasma between the filament and the workpiece; and (c) applying a negative workpiece biasing voltage $V_{WV}$ to the workpiece while a plasma exists between the filament and workpiece, causing ions to migrate from the plasma against the workpiece, uniformly through the anode, causing surface oxidation to be removed from the workpiece by ion sputtering; whereby the surface of the cylindrical workpiece is sputter-cleaned.

12. A method for plasma-enhanced coaxial magnetron sputter-cleaning and coating the interior surfaces of a cylindrical workpiece with a cylindrical sputtering material, as set forth in claim 11, wherein the step of high ion bombarding the interior of the workpiece with material from the cylindrical sputtering material includes the sub steps of applying a magnetron voltage $V_M$, connected with the workpiece and a ground when the surface oxidation is nearly removed from the workpiece by ion sputtering, causing material from the exterior of the cylindrical sputtering material to sputter onto the workpiece; whereby the surface of the cylindrical workpiece is sputter-coated.

13. A method for plasma-enhanced coaxial magnetron sputter-cleaning and coating the interior surfaces of a cylindrical workpiece with a cylindrical sputtering material, as set forth in claim 12, wherein the step of forming a vacuum in the interior of the workpiece by removing gases results in pressure on the order of $10^{-6}$ Torr.

14. A method for plasma-enhanced coaxial magnetron sputter-cleaning and coating the interior surfaces of a cylindrical workpiece with a cylindrical sputtering material, as set forth in claim 13, wherein a working gas is introduced into the vacuum, causing a resulting pressure on the order of a milli-Torr.

15. A method for plasma-enhanced coaxial magnetron sputter-cleaning and coating the interior surfaces of a cylindrical workpiece with a cylindrical sputtering material, as set forth in claim 8, wherein the step of high ion bombarding the interior of the workpiece with material from the cylindrical sputtering material includes the sub step of applying a magnetron voltage $V_M$, connected with the workpiece and a ground when the surface oxidation is nearly removed from the workpiece by ion sputtering, causing material from the exterior of the cylindrical sputtering material to sputter onto the workpiece; whereby the surface of the cylindrical workpiece is sputter-coated.

16. A method for plasma-enhanced coaxial magnetron sputter-cleaning and coating the interior surfaces of a cylindrical workpiece with a cylindrical sputtering material, as set forth in claim 15, wherein the step of forming a vacuum in the interior of the workpiece by removing gases results in pressure on the order of $10^{-6}$ Torr.

17. A method for plasma-enhanced coaxial magnetron sputter-cleaning and coating the interior surfaces of a cylindrical workpiece with a cylindrical sputtering material, as set forth in claim 16, wherein a working gas is introduced into the vacuum, causing a resulting pressure on the order of a milli-Torr.

* * * * *